(12) United States Patent
Umeda et al.

(10) Patent No.: US 7,214,419 B2
(45) Date of Patent: May 8, 2007

(54) CONDUCTIVE PASTE MULTILAYERED BOARD INCLUDING THE CONDUCTIVE PASTE AND PROCESS FOR PRODUCING THE SAME

(75) Inventors: Hiroaki Umeda, Higashiosaka (JP); Hisatoshi Murakami, Higashiosaka (JP); Kiyoshi Iwai, Higashiosaka (JP)

(73) Assignee: Tatsuta Electric Wire & Cable Co., Ltd., Higashiosaka-shi (JP)

( * ) Notice: Subject to any disclaimer, the term of this patent is extended or adjusted under 35 U.S.C. 154(b) by 0 days.

(21) Appl. No.: 10/516,236

(22) PCT Filed: May 27, 2003

(86) PCT No.: PCT/JP03/06621

§ 371 (c)(1),
(2), (4) Date: Nov. 30, 2004

(87) PCT Pub. No.: WO03/105160

PCT Pub. Date: Dec. 18, 2003

(65) Prior Publication Data

US 2006/0057340 A1  Mar. 16, 2006

(30) Foreign Application Priority Data

May 31, 2002 (JP) ............................. 2002-160692

(51) Int. Cl.
*B32B 3/00* (2006.01)
*H01B 1/22* (2006.01)
(52) U.S. Cl. ...................... 428/209; 252/513; 252/514; 252/519; 174/257; 174/264; 427/97; 427/372.2; 148/23; 148/24

(58) Field of Classification Search ........ 428/209–210; 252/510–514, 519; 174/257, 264; 427/97, 427/372.2; 148/22–24
See application file for complete search history.

(56) References Cited

U.S. PATENT DOCUMENTS 4,789,411 A * 12/1988 Eguchi et al. ................. 148/24
5,183,592 A * 2/1993 Ichimura et al. ............. 252/512

(Continued)

FOREIGN PATENT DOCUMENTS

JP  5-217420  8/1993

(Continued)

*Primary Examiner*—Cathy F. Lam
(74) *Attorney, Agent, or Firm*—Jordan and Hamburg LLP (57) ABSTRACT

A conductive paste is provided, which has good conductivity and good adhesiveness to substrates and has good long-lasting stability of these properties, and which, when applied to a through-hole of a multi-layered substrate, ensures improved reliability of bonding to the end faces of conductive layers in the through-hole. Therefore, the paste does not require through-hole plating. The conductive paste comprises (A) 100 parts by weight of a resin component that contains an acrylate resin and an epoxy resin, (B) from 200 to 1800 parts by weight of a metal powder of at least two metals that contain at least one low-melting-point metal having a melting point of not higher than 180° C. and at least one high-melting-point metal having a melting point of not lower than 800° C., (C) from 0.5 to 40 parts by weight of a curing agent that contains from 0.3 to 35 parts by weight of a phenol-type curing agent, and (D) from 0.3 to 80 parts by weight of a flux.

8 Claims, 3 Drawing Sheets

U.S. PATENT DOCUMENTS

| | | | |
|---|---|---|---|
| 5,744,758 A * | 4/1998 | Takenouchi et al. | 174/255 |
| 5,779,941 A * | 7/1998 | Umeda et al. | 252/512 |
| 5,914,358 A * | 6/1999 | Kawakita et al. | 523/458 |
| 6,054,175 A * | 4/2000 | Akiha et al. | 427/123 |
| 6,060,150 A * | 5/2000 | Nakatani et al. | 428/209 |
| 6,207,259 B1 * | 3/2001 | Iino et al. | 428/209 |
| 6,326,555 B1 * | 12/2001 | McCormack et al. | 174/255 |
| 6,359,235 B1 * | 3/2002 | Hayashi | 174/260 |
| 6,376,052 B1 * | 4/2002 | Asai et al. | 428/209 |
| 6,558,780 B2 * | 5/2003 | Suzuki et al. | 428/209 |

FOREIGN PATENT DOCUMENTS

| | | |
|---|---|---|
| JP | 9-46013 | 2/1997 |
| JP | 10-12044 | 1/1998 |
| JP | 2002-198656 | 7/2002 |

* cited by examiner

CONDUCTIVE PASTE MULTILAYERED BOARD INCLUDING THE CONDUCTIVE PASTE AND PROCESS FOR PRODUCING THE SAME

TECHNICAL FIELD

The present invention relates to a conductive paste, more precisely, to a conductive paste used for substrate hole filling, conductive adhesive, electrode formation, part mounting, electromagnetic wave shielding, conductive bump formation, etc. The invention also relates to a multi-layered substrate using the conductive paste, and to a method for producing it.

BACKGROUND ART

A conductive paste that may be used for substrate hole filling generally comprises a thermosetting resin and a conductive filler added to it, and in such a paste, the conductive filler is kept in contact with each other to ensure the conductivity of the paste.

Figure 3:
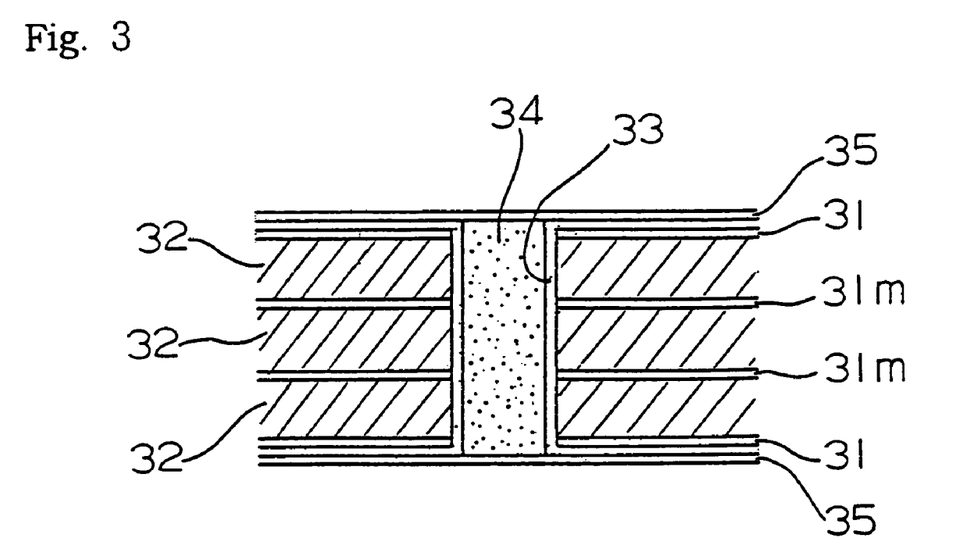
FIG. 3 is an enlarged, schematic cross-sectional view showing one example of a multi-layered substrate in the related art.

Recently, a multi-layered substrate has become used for high-density mounting thereon, which is prepared by alternately laminating multiple conductive layers and multiple insulating layers. FIG. 3 is an enlarged, schematic cross-sectional view showing one example of such a multi-layered substrate, in which the reference numeral 31 indicates a conductive layer of copper foil or the like, the reference numeral 31m indicates an inner conductive layer of the type, and the reference numeral 32 indicates an insulating layer of resin or the like.

For inner layer conduction in the multi-layered substrate of the type, a through-hole that runs through the multi-layered substrate is formed in the substrate, a through-hole plate 33 is applied to it, then this is filled with a hole-filling paste 34, and after cured, the excess hole-filling paste 34 is removed by polishing, and thereafter this is covered with a cover plate 35 (for example, see JP-A 4-91489, FIG. 3; Material Technology and Production Process in Built-up Wiring Board (published by the Association of Technology Information, page 60). However, the process is problematic in that the accuracy in pattern formation therein could not be increased since the copper foil on the substrate surface will be thick owing to the twice-plating step of through-hole plating and cover plating therein. Accordingly, it is desired to attain the intended inner layer conduction with a conductive paste alone, without effecting through-hole plating and cover plating. However, the above-mentioned, conventional powder contact-type paste is unsatisfactory in point of the reliability of bonding to the end faces of inner layers, and it could not ensure stable inner layer conduction.

Figure 4:
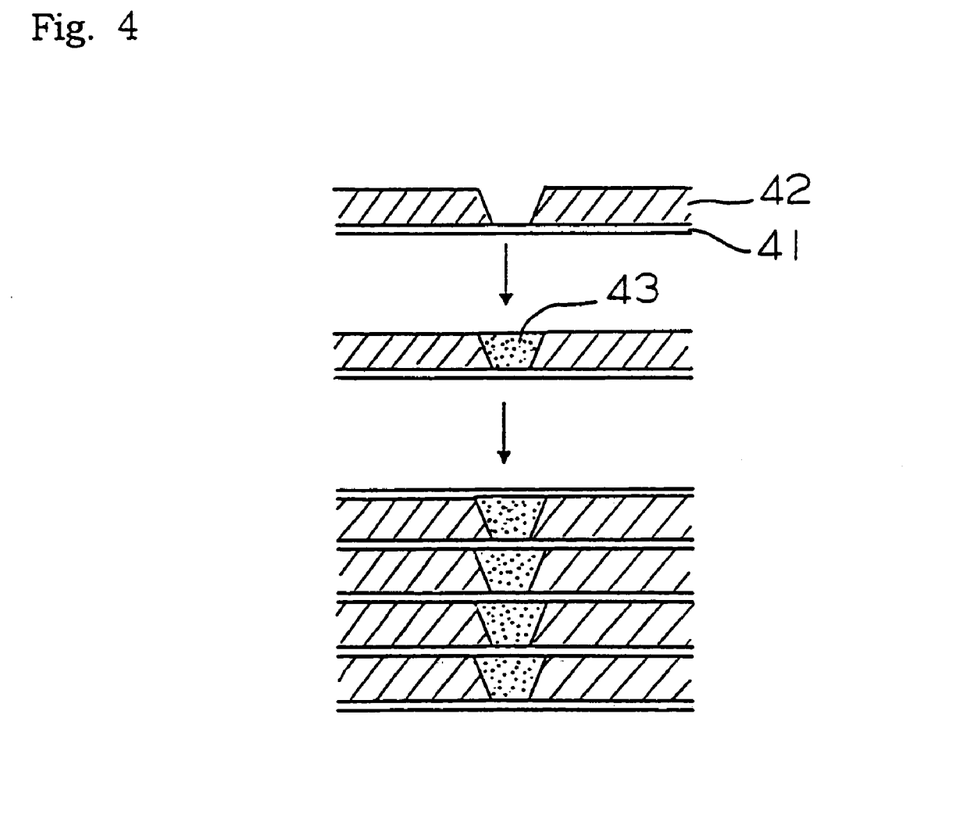
FIG. 4 is an enlarged, schematic cross-sectional view showing a method for producing a multi-layered substrate in a mode of stacking.

Contrary to this, a multi-layered substrate that may be formed according to the process shown in FIG. 4 is now employed in the art. In FIG. 4, the reference numeral 41 indicates a conductive layer, the reference numeral 42 indicates an insulating layer, and the reference numeral 43 indicates a conductive paste. The multi-layered substrate of the type is produced as follows: A hole is formed in every layer, and filled with a conductive paste 43, and then the layers are laminated in such a controlled manner that the filled holes could be in a line, and thereafter stacked by pressing. However, the multi-layered substrate is also problematic in that it requires a number of production steps and its production costs therefore increase, since the layers are separately holed and the respective holes are also separately filled with paste. In addition, since the production process includes the pressing step, it is still problematic in that the conductivity of the products may fluctuate owing to the fluctuation in the pressing pressure, and the process could not apply to multi-layered substrates with parts buried therein, and therefore its application area is limited.

The present invention has been made in consideration of the above-mentioned matters, and its object is to provide a conductive paste which has good conductivity and good adhesiveness to substrates and which, when applied to a through-hole of a multi-layered substrate, ensures improved reliability of bonding to the end faces of conductive layers in the through-hole. Another object of the invention is to provide a multi-layered substrate using the paste, which enables high-accuracy patterning thereon, not requiring through-hole plating and cover plating as in the related art. Still another object is to provide a method of producing such a multi-layered substrate, in which the production steps are significantly simplified as compared with those in the related art and which therefore enables cost reduction.

DISCLOSURE OF THE INVENTION

To solve the above-mentioned problems, the conductive paste of the invention comprises (A) 100 parts by weight of a resin component that contains an acrylate resin and an epoxy resin, (B) from 260 to 1800 parts by weight of a metal powder of at least two metals that contain at least one low-melting-point metal having a melting point of not higher than 180° C. and at least one high-melting-point metal having a melting point of not lower than 800° C., (C) from 0.5 to 40 parts by weight of a curing agent that contains from 0.3 to 35 parts by weight of a phenol-type curing agent, and (D) from 0.3 to 80 parts by weight of a flux.

The component (A) may be either a combination of an acrylate resin and an epoxy resin, or a mixture of an acrylate resin and an epoxy resin with one or more resins selected from a group consisting of an alkyd resin, a melamine resin and a xylene resin, added thereto in a proportion of less than 40% by weight of the total amount of the component (A).

The low-melting-point metal of the component (B) may be indium alone, or an alloy of two or more selected from a group consisting of tin, lead, bismuth and indium; and the high-melting-point metal may be one selected from a group consisting of gold, silver, copper and nickel, or an alloy of two or more of these metals.

The component (C) may be a combination of a phenol-type curing agent, and one or more selected from a group consisting of an imidazole-type curing agent, a cation-type curing agent, and a radical-type curing agent.

The multi-layered substrate of the invention comprises multiple conductive layers and multiple insulating layers alternately laminated with each other, in which a through-hole to run through it is formed and this is filled with the above-mentioned conductive paste of the invention and heated whereby the metal powder in the conductive paste is metallized.

The method for producing such a multi-layered substrate of the invention is for producing a multi-layered substrate of alternately-laminated multiple conductive layers and insulating layers, and this comprises forming a through-hole in a multi-layered substrate to run through it, filling the through-hole with the conductive paste of the invention and heating it to thereby cure the conductive paste.

BEST MODE FOR CARRYING OUT THE INVENTION

The conductive paste of the invention comprises, as in the above, (A) 100 parts by weight (hereinafter this is simply "parts") of a resin component that contains an acrylate resin and an epoxy resin, (B) from 200 to 1800 parts of a metal powder of at least two metals that contain a low-melting-point metal and a high-melting-point metal, (C) from 0.5 to 40 parts of a curing agent that contains from 0.3 to 35 parts of a phenol-type curing agent, and (D) from 0.3 to 80 parts of a flux, all as the indispensable ingredients thereof. When this is heated, then the resin component (A) is cured and the metal powder (B) is metallized to exhibit good conductivity and good adhesiveness to substrates.

Figure 5:
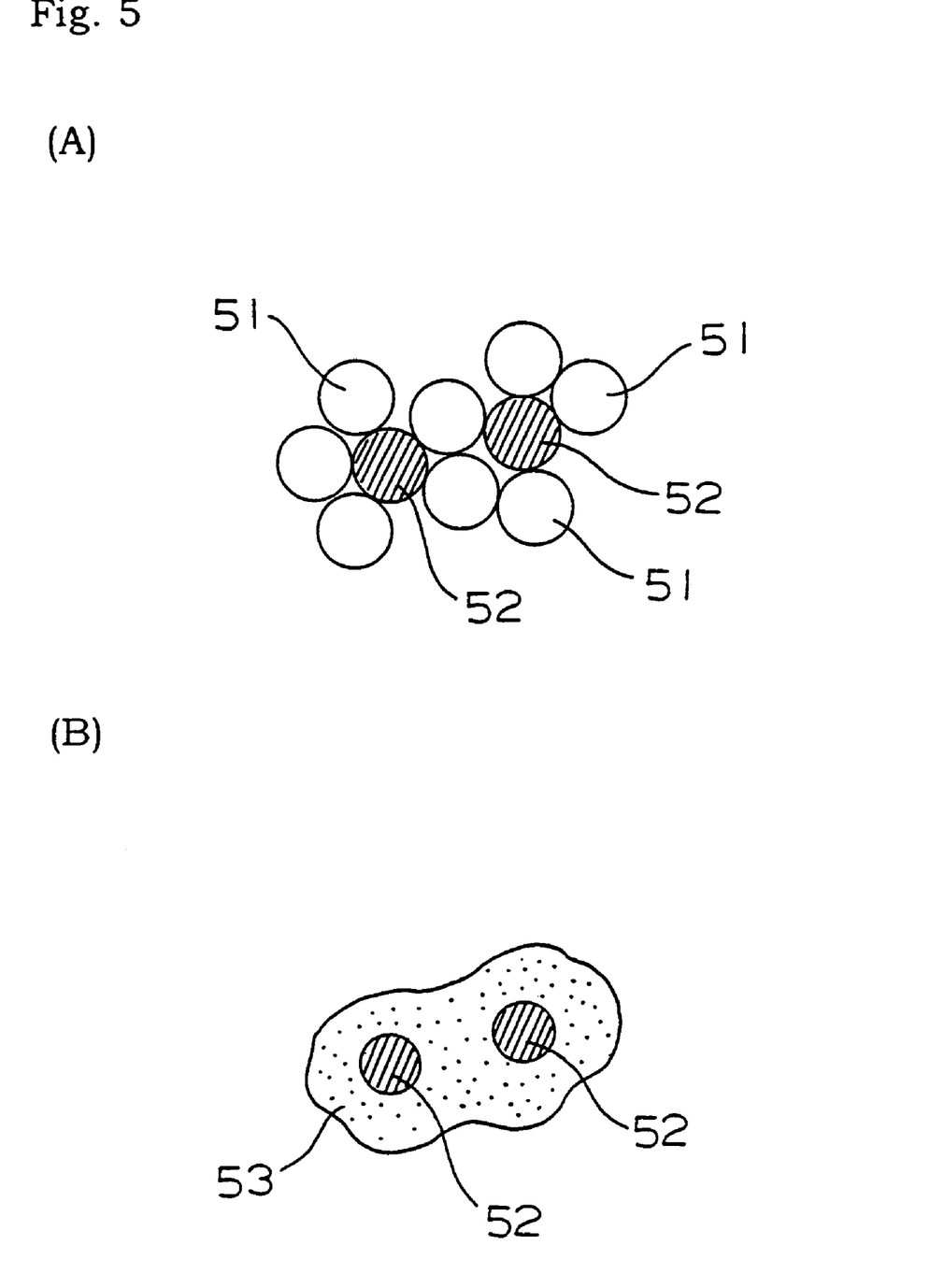
FIG. 5 is an enlarged, schematic cross-sectional view showing metallization of low-melting-point metal particles and high-melting-point metal particles.

The metallization as referred to herein is meant to indicate that at least two metals are melted and integrated. For example, when a mixture of low-melting-point metal particles 51 and high-melting-point metal particles 52 is heated for metallization, as in FIG. 5(A), then the surfaces of the low-melting-point metal particles 51 and the high-melting-point metal particles 52 are melted and integrated to form an alloy layer 53, as in FIG. 5(B). The alloy layer 53 has a higher melting point than the original low-melting-point metal. The figures are schematic figures merely for showing the concept of metallization, and do not show the actual shape and the actual size of particles.

Embodiments of the conductive paste of the invention and the multi-layered substrate using it of the invention are described in detail hereinunder, but the invention should not be limited to these. In this description, the conductive paste after cured may be referred to also as "conductive paste" for convenience sake.

The resin component (A) of the conductive paste of the invention that contains an acrylate resin and an epoxy resin may be a combination of an acrylate resin and an epoxy resin alone, or a mixture prepared by adding at least one of alkyd resin, a melamine resin and a xylene resin to the combination of an acrylate resin and an epoxy resin.

The acrylate resin for use in the invention may be any one having one or more reactive groups of the following structural formula (I) in the molecule, and two or more such acrylate resins may be combined for use herein.

In formula (I), R represents H or an alkyl group. Though not specifically defined, the alkyl group generally has from 1 to 3 carbon atoms.

As examples of the monomers to constitute acrylate resin, listed are isoamyl acrylate, neopentylglycol diacrylate, trimethylolpropane triacrylate, ditrimethylolpropane tetraacrylate, phenyl glycidyl ether acrylate hexamethylene diisocyanate urethane prepolymer, bisphenol A/diglycidyl ether acrylate adduct, ethylene glycol dimethacrylate, diethylene glycol dimethacrylate and so on.

The epoxy resin may be any one having at least one epoxy group in the molecule, and two or more such epoxy resins may be combined for use herein. As its examples, listed are bisphenol A-type epoxy resin, bromoepoxy resin, bisphenol F-type epoxy resin, novolak-epoxy resin, alicyclic epoxy resin, glycidylamine-type epoxy resin, glycidyl ether-type epoxy resin, glycidyl ester-type epoxy resin, heterocyclic epoxy resin and so on.

The alkyd resin, melamine resin and xylene resin serve as a resin modifier, and not specifically defined, they may be any ones capable of attaining their object.

When the acrylate resin and the epoxy resin are blended with at least one of alkyd resin, melamine resin and xylene resin, then the blend ratio of the resins may be such that the proportion of the acrylate resin and the epoxy resin to the overall amount of the component (A) is at least 60% by weight, preferably at least 90% by weight. In other words, the proportion of the other resin that is blended as a modifier is less than 40% by weight, preferably less than 10% by weight.

The blend ratio (% by weight) of the acrylate resin to the epoxy resin may fall between 5/95 and 95/5, preferably between 20/80 and 80/20. If the proportion of the acrylate resin is less than 5% by weight, then the viscosity change will increase, but if larger than 95% by weight, then the physical properties of the cured paste may worsen.

The metal powder (B) in the invention may be any one that contains at least two metals of at least one low-melting-point metal having a melting point of not higher than 180° C. and at least one high-melting-point metal having a melting point of not lower than 800° C., in any form of the metals capable of undergoing metallization under heat. Though not specifically defined, the existing morphology of the above-mentioned at least two metals includes, for example, a mixture of a type of metal powder with a different metal powder of another type of metal; a type of metal powder coated with a different type of metal; and a mixture of these.

The low-melting-point metal and the high-melting-point metal may be single metals, or may be alloys of at least two metals. Preferred examples of the low-melting-point metal are indium (melting point: 156° C.) alone, and an alloy of at least two of tin (melting point: 231° C.), lead (melting point: 327° C.), bismuth (melting point: 271° C.) and indium, and the alloy is so formulated that it may have a melting point of not higher than 180° C. Preferred examples of the high-melting-point metal are one selected from a group consisting of gold (melting point: 1064° C.), silver (melting point: 961° C.), copper (melting point: 1083° C.) and nickel (melting point: 1455° C.), and an alloy of two or more of these metals.

Not specifically defined, the metal powder may be in any form heretofore employed in the art, including, for example, dendritic, spherical or flaky particles. The particle size of the powder particles is not also specifically defined, but generally falls between 1 and 50 μm or so in terms of the mean particle size thereof.

The amount of the metal powder to be in the paste is from 200 to 1800 parts relative to 100 parts of the resin component (A). If it is smaller than 200 parts, then the paste could not have good conductivity. If larger than 1800 parts, then the viscosity of the paste will be too high and the paste would be of no practical use. Preferably, the blend ratio (by weight, the same shall apply hereinunder) of the low-melting-point metal powder to the high-melting-point metal powder falls between 8/2 and 2/8.

The curing agent (C) indispensably contains a phenol-type curing agent. The other curing agent may be selected, depending on the type of the component (A), and its examples are an imidazole-type curing agent, a cation-type curing agent and a radical-type curing agent (polymerization initiator). However, any others that could not be grouped into these may also be used herein. Two or more curing agents except the phenol-type curing agent may be combined for use herein.

The advantages of the epoxy resin used in the invention are that it has very good adhesiveness and it does not form depressions and voids. However, when a flux is added to it, like in the paste of the invention, then the flux serves as a curing promoter for the epoxy resin and causes a problem in that the pot life of the paste is shortened. In the invention, an acrylate resin and an epoxy resin are combined for the resin component and a phenol-type curing agent is used for the combination to solve the problem. Specifically, in the invention, the phenol-type curing agent serves as a polymerization inhibitor for the acrylate resin, and therefore, the acrylate resin does not almost cure at room temperature. Since the paste comprises such a non-curing resin, it is stable with no viscosity change at room temperature. On the other hand, when the paste is heated, then the epoxy resin therein first reacts with the phenol-type curing agent therein and then the acrylate resin having lost the polymerization inhibitor reacts to cure the paste.

The amount of the phenol-type curing agent to be in the paste is from 0.3 to 35 parts relative to 100 parts of the resin therein. If it is smaller than 0.3 parts, then the pot life of the paste will be short; but if larger than 35 parts, then the viscosity of the paste will increase and the operability with the paste may worsen. The amount of the other curing agent than the phenol-type curing agent to be in the paste is preferably from 0.2 to 35 parts relative to 100 parts of the resin therein, and the overall amount of the curing agent is from 0.5 to 40 parts. If the overall amount of the curing agent is smaller than 0.5 parts, then the paste may be insufficiently cured and, as a result, it could not have good conductivity and good physical properties. On the other hand, if the amount is larger than 40 parts, then the pot life of the paste will be short and there may occur another problem in that the excess curing agent may worsen the conductivity and the physical properties of the cured paste.

As examples of the phenol-type curing agent, listed are novolak-phenol, naphthol compounds and so on.

As examples of the imidazole-type curing agent, listed are imidazole, 2-undecylimidazole, 2-heptadecylimidazole, 2-ethylimidazole, 2-phenylimidazole, 2-ethyl-4-methylimidazole, and 1-cyanoethyl-2-undecylimidazole.

As examples of the cation-type curing agent, listed are boron trifluoride amine salts, and onium compounds such as typically p-methoxybenzenediazonium hexafluorophosphate, diphenyliodonium hexafluorophosphate, triphenylsulfonium, tetra-n-butylphosphonium tetraphenylborate, tetra-n-butylphosphonium-O,O-diethylphosphorodithioate.

As examples of the radical-type curing agent (polymerization initiator), listed are dicumyl peroxide, t-butylcumyl peroxide, t-butyl hydroperoxide, cumene hydroperoxide and so on.

The flux of the component (D) is to promote the metallization of the metal powder, including, for example, zinc chloride, lactic acid, citric acid, oleic acid, stearic acid, glutamic acid, benzoic acid, oxalic acid, glutamic acid hydrochloride, aniline hydrochloride, cetylpyridinium bromide, urea, triethanolamine, glycerin, hydrazine, rosin and so on. The amount of the flux to be in the paste is from 0.3 to 80 parts relative to 100 parts of the resin therein. If the amount of the flux is smaller than 0.3 parts, then the metallization of the metal powder could not be sufficiently effected; but if larger than 80 parts, then too much flux may have some negative influences on the adhesiveness and the physical properties of the cured paste.

The conductive paste of the invention may be prepared by well mixing the predetermined amounts of the constitutive components mentioned above.

If desired, the conductive paste of the invention may contain any additives that may be heretofore added to conductive paste of the same type, not overstepping the object of the invention. Examples of the additives are defoaming agent, thickener, adhesive agent, etc.

When the conductive paste of the invention thus obtained in the manner as above is heated under a predetermined condition, then the resin therein is cured and the metal powder is melted and metallized. Therefore, when the paste is used for filling a through-hole of a multi-layered substrate, then the metal powder is integrated with each other and the metal powder and the end faces of the conductive layers inside the through-hole are also integrated with each other. Accordingly, the cured paste may have higher conductivity as compared with a case where the metal powder is merely in mutual contact with each other or the metal powder is in mere contact with the end faces of conductive layers, and, in addition, the reliability of bonding of the cured paste to the end faces of the conductive layers significantly increases. Further, since the conductive paste has good adhesiveness also to insulating layers of a multi-layered substrate, the multi-layered substrate comprising it may have high and long-lasting reliability.

The multi-layered substrate using the conductive paste of the invention, and a method for producing it are described below.

Figure 1:
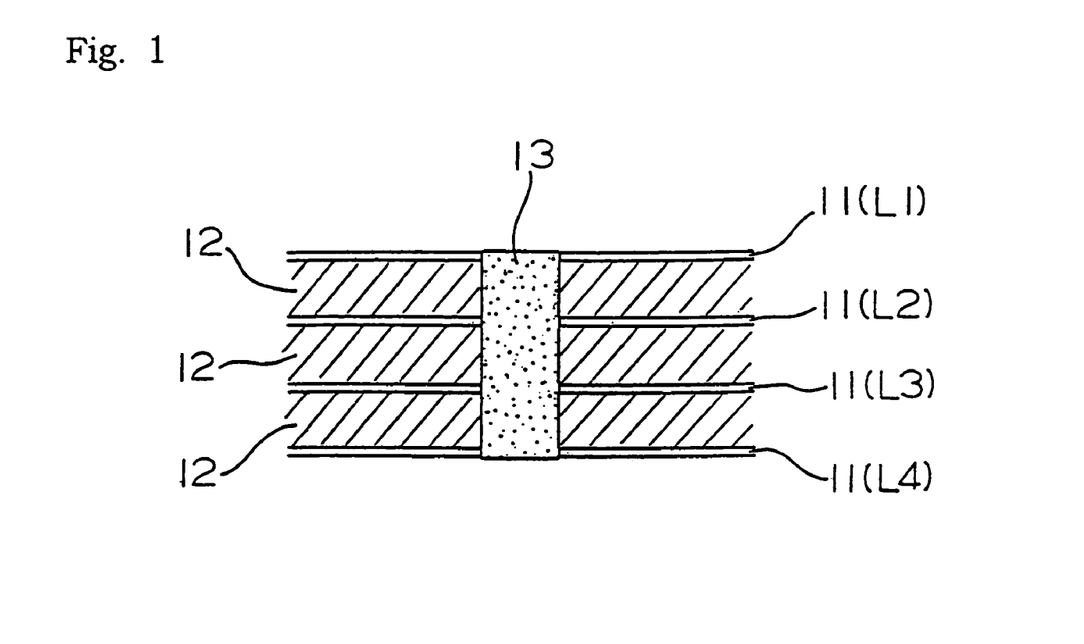
FIG. 1 is an enlarged, schematic cross-sectional view showing one example of the multi-layered substrate of the invention.

FIG. 1 is an enlarged, schematic cross-sectional view showing one example of the multi-layered substrate of the invention. In FIG. 1, the reference numeral 11 (L1 to L4) indicates a conductive layer; the reference numeral 12 indicates an insulating layer, and the reference numeral 13 indicates a filled substance formed through curing of a conductive paste. The multi-layered substrate illustrated in this figure comprises laminated conductive layers 11 and insulating layers 12, and its structure itself is the same as that of the related art shown in FIG. 3. However, this differs from the structure of FIG. 3 in that the through-hole is not plated and therefore the filled substance is in direct contact with the inner wall of the through-hole, and that this does not have a cover plate.

The multi-layered substrate illustrated in this figure may be produced, for example, as follows: A through-hole is formed with a drill or laser, and not plated, this is directly filled with a conductive paste and heated under a predetermined condition to cure the resin component and to simultaneously metallize the metal powder. After cured, the excess cured part that protrudes from the substrate surface is removed by polishing.

The heating condition for the conductive paste is so selected that it may satisfy both curing of the resin component and metallization of the metal powder. Therefore, the concrete condition varies depending on the paste composition. Generally, however, the heating may be effected at a temperature falling within a range of from about 150 to 180° C. and for a period of time of from about 30 to 120 minutes or so.

Figure 2:
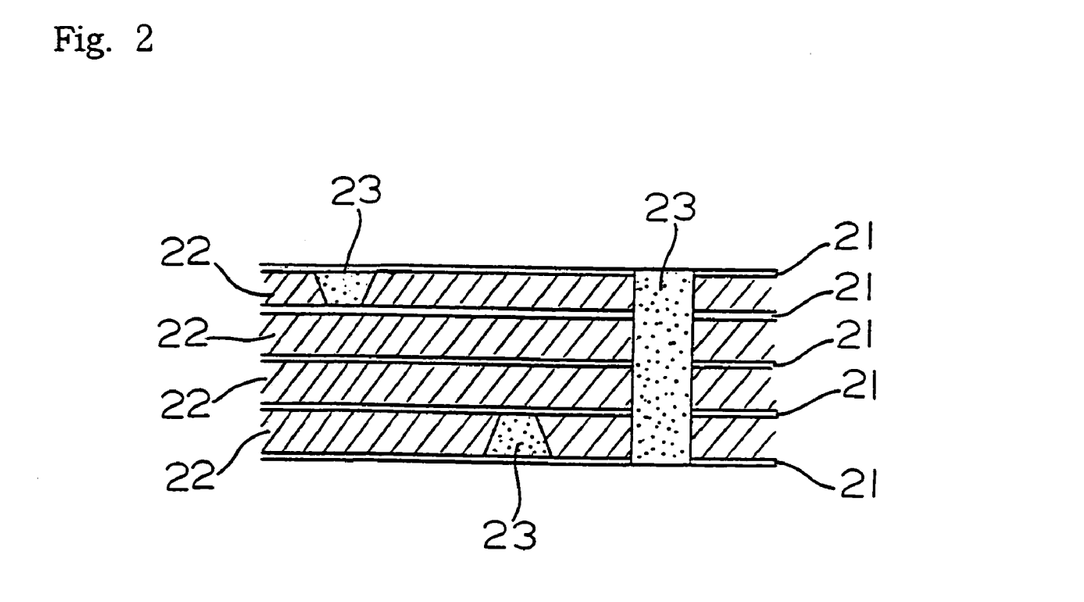
FIG. 2 is an enlarged, schematic cross-sectional view showing an example of a composite-type multi-layered substrate.

Not limited to the structure of FIG. 1, the multi-layered substrate of the invention may have any other structure, for example, as in FIG. 2. In FIG. 2, the reference numeral 21 indicates a conductive layer, 22 indicates an insulating layer, and 23 indicates a conductive paste. The multi-layered substrate illustrated in this figure has a through-hole and additionally has an independent filled hole partly in some layers therein (its structure is a composite through-hole/bottomed via-hole structure).

EXAMPLES

Examples of the invention are described below, to which, however, the invention should not be limited.

Components were mixed in the ratio as in Tables 1 and 2 to prepare various conductive pastes. The details of the components used herein are shown below.

Acrylate resin: 2-hydroxy-3-acryloyloxypropylmethacrylate (80% by weight), triethyleneglycol diacrylate (20% by weight).
Epoxy resin: Epoxy resin EP-4901E (from Asahi Denka Kogyo, 80% by weight) and ED-529 (from Asahi Denka Kogyo, 20% by weight).
Alkyd resin: EZ-3020-60-S (from Dai-Nippon Ink Chemical Industry).
Melamine resin: L-121-60 (from Dai-Nippon Ink Chemical Industry).
Xylene resin: Nicanol PR-1540 (from Nippon Gas Chemical).
Metal powder: Sn—Bi alloy metal powder (Sn/Bi=42/58, melting point 138° C., particle size 20 μm, 50% by weight) and silver powder (melting point 961° C., particle size 20 μm, 50% by weight).
Imidazole-type curing agent: 2-ethylimidazole.
Cation-type curing agent: tetra-n-butylphosphonium tetraphenylborate.
Phenol-type curing agent: Tamanol 758 (from Arakawa Chemical Industry).
Radical-type curing agent: cumene hydroperoxide.
Flux: rosin.

The conductive paste obtained in the manner as above was heated at 160° C. for 60 minutes and cured, and its melting point was measured through TG/DTA. As a result, an endothermic peak indicating the melting point was seen at around 260° C. Observing the cured paste with an electronic microscope and an X-ray micro analyzer confirmed the metallization of the metal powder in the cured paste.

Next, through-holes (pore size 0.3 mm, 1000-hole chain pattern) were formed in a multi-layered substrate comprising alternately-laminated conductive layers (copper foil; thickness, 18 μm) and insulating layers (glass-epoxy; thickness, about 200 μm), filled with the above-mentioned conductive paste, and cured at 160° C. for 60 minutes, and the excess cured part protruding from the surface was removed by polishing. The process gave a multi-layered substrate having a structure as in FIG. 1.

The initial resistance value ($R_0$) (mΩ/hole) was measured between the conductive layers L1–L2, L1–L4 and L3–L4.

For evaluating the long-term reliability thereof, the substrate was tested in a pressure-cooker test (PCT) (2 atmospheres, humidity 100%, 121° C., 36 hours). After the test, the resistance value ($R_P$) was measured between L1–L2, L1–L4 and L3–L4. In addition, the substrate was tested in a heat-cycle test (−65° C. to 125° C., 1000 cycles), and after the test, the resistance value ($R_H$) was measured between L1–L2, L1–L4 and L3–L4. According to the formula (1) mentioned below, the resistance change (%) relative to the initial resistance value was obtained.

$$\text{Resistance Change (\%)}=[(R_X-R_0)/R_0]\times 100 \qquad (1)$$

wherein $R_X$ indicates $R_P$ or $R_H$.

In addition, the conductive pastes were evaluated in point of the printability thereof. Concretely, holes each having a pore size of 300 μm were formed in a substrate having a thickness of 1 mm, and this was printed for filling the holes by the use of a 200-mesh Tetron screen plate. The printing test is for evaluating the potency of the paste to fill the holes. The samples where the holes were completely filled with the paste were good (O); and those where the holes were not completely filled with it were not good (x).

Further, the initial viscosity ($V_0$) of the paste and the viscosity thereof ($V_7$) after left for 7 days at room temperature were measured by the use of a BH-type viscometer with a rotor No. 7 (10 rpm), and the viscosity change (%) was obtained according to the formula (2) mentioned below.

$$\text{Viscosity change (\%)}=[(V_7-V_0)/V_0]\times 100 \qquad (2)$$

The results of the above-mentioned evaluation tests are shown in Tables 1 and 2.

TABLE 1

| Example No. | 1 | 2 | 3 | 4 | 5 | 6 | 7 | 8 | 9 | 10 | 11 | 12 |
|---|---|---|---|---|---|---|---|---|---|---|---|---|
| Acrylate Resin | 50 | 70 | 70 | 70 | 40 | 40 | 40 | 50 | 50 | 50 | 50 | 50 |
| Epoxy Resin | 50 | 20 | 20 | 20 | 20 | 20 | 20 | 50 | 50 | 50 | 50 | — |
| Alkyd Resin | — | 10 | — | — | 40 | — | — | — | — | — | — | — |
| Melamine Resin | — | — | 10 | — | — | 40 | — | — | — | — | — | — |
| Xylene Resin | — | — | — | 10 | — | — | 40 | — | — | — | — | — |
| Metal Powder | 1000 | 1000 | 1000 | 1000 | 1000 | 1000 | 1000 | 1000 | 200 | 1800 | 1000 | 1000 |

TABLE 1-continued

| Example No. | | 1 | 2 | 3 | 4 | 5 | 6 | 7 | 8 | 9 | 10 | 11 | 12 |
|---|---|---|---|---|---|---|---|---|---|---|---|---|---|
| Imidazole-type Curing Agent | | — | — | — | — | — | — | — | 1.5 | — | — | 1.5 | — |
| Cation-type Curing Agent | | 5 | 5 | 5 | 5 | 5 | 5 | 5 | — | 5 | 5 | 0.5 | — |
| Phenol-type Curing Agent | | 15 | 15 | 15 | 15 | 15 | 15 | 15 | 15 | 15 | 15 | 15 | 35 |
| Radical-type Curing Agent | | — | — | — | — | — | — | 2 | — | — | — | — | 1.5 |
| Flux | | 10 | 10 | 10 | 10 | 10 | 10 | 10 | 10 | 10 | 10 | 10 | 10 |
| Printability | | ○ | ○ | ○ | ○ | ○ | ○ | ○ | ○ | ○ | ○ | ○ | ○ |
| Resistance Value [initial] (mΩ/hole) | L1–L2 | 5.5 | 6.1 | 6.3 | 6.5 | 7.1 | 6.8 | 6.9 | 6.8 | 5.2 | 5.7 | 7.1 | 6.7 |
| | L1–L4 | 11.5 | 12.2 | 12.9 | 12.1 | 12.9 | 12.7 | 12.7 | 12.1 | 12.5 | 11.5 | 14 | 13.1 |
| | L3–L4 | 5.3 | 6.2 | 6.1 | 6.3 | 6.9 | 7.2 | 7.0 | 6.2 | 6.5 | 5.9 | 7 | 6.6 |
| Resistance Change [PCT] (%) | L1–L2 | 2 | 4 | 4 | 5 | 6 | 7 | 6 | 4 | 5 | 4 | 4 | 5 |
| | L1–L4 | 5 | 6 | 7 | 6 | 7 | 7 | 8 | 5 | 7 | 5 | 57 | |
| | L3–L4 | 2 | 4 | 4 | 5 | 7 | 6 | 6 | 3 | 4 | 4 | 6 | 6 |
| Resistance Change [heat cycle] (%) | L1–L2 | −1 | 3 | 1 | 2 | 3 | 4 | 5 | 2 | 1 | −1 | 2 | 2 |
| | L1–L4 | 1 | 3 | 0 | 1 | 4 | 4 | 5 | 0 | 0 | 0 | 0 | 3 |
| | L3–L4 | 0 | 1 | −1 | −1 | 1 | 5 | 3 | 1 | 1 | 1 | 2 | 4 |
| Viscosity Change (%) | | 4 | 5 | 8 | 12 | 16 | 15 | 17 | 20 | 7 | 16 | 2 | 20 |

TABLE 2

| Comparative Example No. | | 1 | 2 | 3 | 4 | 5 |
|---|---|---|---|---|---|---|
| Acrylate Resin | | 50 | 70 | 50 | 50 | — |
| Epoxy Resin | | 50 | 20 | 50 | 50 | 100 |
| Alkyd Resin | | — | 10 | — | — | — |
| Metal Powder | | 150 | 1850 | 1000 | 1000 | 1000 |
| Cation-type Curing Agent | | 5 | 5 | 0.1 | 5 | 5 |
| Phenol-type Curing Agent | | 15 | 15 | 15 | 40 | 15 |
| Flux | | 10 | 10 | 10 | 10 | 10 |
| Printability | | ○ | X | ○ | X | ○ |
| Resistance Value [initial] (mΩ/hole) | L1–L2 | 60 | — | 33 | — | 8 |
| | L1–L4 | 121 | — | 61 | — | 15 |
| | L3–L4 | 70 | — | 30 | — | 8.1 |
| Resistance Change [PCT] (%) | L1–L2 | ∞ | — | ∞ | — | 5 |
| | L1–L4 | ∞ | — | ∞ | — | 6 |
| | L3–L4 | ∞ | — | ∞ | — | 4 |
| Resistance Change [heat cycle] (%) | L1–L2 | ∞ | — | ∞ | — | 3 |
| | L1–L4 | ∞ | — | ∞ | — | 1 |
| | L3–L4 | ∞ | — | ∞ | — | 3 |
| Viscosity Change (%) | | 5 | immeasurable | 8 | 120 | gelled |

INDUSTRIAL APPLICABILITY

The invention provides a conductive paste having good conductivity and good adhesiveness to substrate and having good long-term stability of these properties.

The multi-layered substrate that uses the conductive paste of the invention for filling through-holes formed therein has improved reliability of bonding of the paste to the end faces of the conductive layers inside the through-holes, and therefore enables high-accuracy patterning thereon, not requiring through-hole plating and cover plating as in the related art.

The method for producing such a multi-layered substrate does not include a step of through-hole plating and cover plating as in the related art, a step of forming holes separately in layers and separately filling them, and a pressing step, and therefore, the production steps in the method are simplified and the production costs may be reduced. In addition, since the method does not include a pressing step, its another advantage is that the conductivity of the products produced is prevented from fluctuating owing to the pressing step.

Having such good conductivity, adhesiveness and long-term reliability, the conductive paste of the invention may be favorably used not only for the above-mentioned hole filling in multi-layered substrates but also for conductive adhesives, electrode formation, part mounting, electromagnetic wave shielding, conductive bump formation, etc. In addition, since the paste of the invention contains no solvent, it may be filled in bottomed via-holes in any ordinary manner such as vacuum printing.

The invention claimed is:

1. A conductive paste, comprising:
   (A) 100 parts by weight of a resin component that contains on acrylate resin and an epoxy resin;
   (B) from 200 to 1800 parts by weight of a metal powder component of at least two metals that contain at least one low-melting-point metal having a melting point of not higher than 180° C. and at least one high-melting-point metal having a melting point of not lower than 800° C.;
   (C) from 0.5 to 40 parts by weight of a curing agent component that contains from 0.3 to 35 parts by weight of a phenol-type curing agent; and
   (D) from 0.3 to 80 parts by weight of a flux.

2. The conductive paste as claimed in claim 1, wherein the resin component (A) is a combination of an acrylate resin and an epoxy resin.

3. The conductive paste as claimed in claim 1, wherein the resin component (A) is a mixture of an acrylate resin and an epoxy resin with one or more resins selected from a group consisting of art alkyd resin, a melamine resin and a xylene resin, added thereto in a proportion of less than 40% by weight of the total amount of the resin component (A).

4. The conductive paste as claimed in any one of claims 1 to 3, wherein the low-melting-point metal of the metal powder component (B) is indium alone, or an alloy of two or more selected from a group consisting of tin, lead, bismuth and indium.

5. The conductive paste as claimed in any one of claims 1 to 3, wherein the high-melting-point metal or the metal powder component (B) is one selected from a group consisting of gold, silver, copper and nickel, or an alloy of two or more of these metals.

6. The conductive paste as claimed in any one of claims 1 to 3, wherein the curing agent component (C) is a combination of a phenol-type curing agent, and one or more curing agents selected from a group consisting of an imidazole-type curing agent, a cation-type curing agent and a radical-type curing agent.

7. A multi-layered substrate comprising multiple conductive layers and multiple insulating layers alternately laminated with each other, wherein:

a through-hole is formed in the multi-layered substrate;

the through-hole is filled with the conductive paste of any one of claims 1 to 3; and said conductive paste in said through-hole is heated whereby the metal powder component in the conductive paste is metallized.

8. A method for producing a multi-layered substrate of alternately-laminated multiple conductive layers and insulating layers, which comprises:

forming a through-hole in a multi-layered substrate;

filling the through-hole with the conductive paste of any one of claims 1 to 3; and healing said conductive paste in said through-hole to thereby cure the conductive paste.

* * * * *